United States Patent
Rha

[11] Patent Number: 6,108,245
[45] Date of Patent: Aug. 22, 2000

[54] WRITE RECOVERY TIME CONTROL CIRCUIT IN SEMICONDUCTOR MEMORY AND CONTROL METHOD THEREOF

[75] Inventor: Jun-Ho Rha, Chungcheongbuk-do, Rep. of Korea

[73] Assignee: LG Semicon Co., Ltd., Chungcheongbuk-Do, Rep. of Korea

[21] Appl. No.: 09/207,260

[22] Filed: Dec. 9, 1998

[30] Foreign Application Priority Data

Jul. 18, 1998 [KR] Rep. of Korea .................. 98-28992

[51] Int. Cl.$^7$ ...................................... G11C 7/00
[52] U.S. Cl. ............... 365/189.08; 365/194; 365/230.06
[58] Field of Search .............. 365/189.08, 194, 365/230.06, 189.01, 230.01

[56] References Cited

U.S. PATENT DOCUMENTS 5,091,889  2/1992  Hamano et al. ................... 365/233.5
5,357,479  10/1994  Matsui ............................ 365/230.06
5,495,449  2/1996  Park ................................ 365/203

*Primary Examiner*—David Nelms
*Assistant Examiner*—Hoai V. Ho

[57] ABSTRACT

The write recovery time control circuit includes a power control signal generating circuit, a decoder circuit and a write disabling signal generating circuit. The power control signal generating circuit generates a power control signal based on a cell block address signal, at least one bit of a predecoded address signal, and a write disabling signal. The decoder circuit generates word line selection signals based on the predecoded address signal and the power control signal. The write disabling signal generating circuit generates the write disabling signal such that changes in said power control signal are delayed by a predetermined period of time.

34 Claims, 5 Drawing Sheets

WRITE RECOVERY TIME CONTROL CIRCUIT IN SEMICONDUCTOR MEMORY AND CONTROL METHOD THEREOF

BACKGROUND OF THE INVENTION

1. Field of Invention

The present invention relates to a semiconductor memory, more particularly, to a write recovery time control circuit and a control method thereof which provides sufficient write recovery time between a write and a read operation.

2. Discussion of Related Art

Input data signals having been latched to a data input buffer of a DRAM are transferred to a data bus line by write control signals. A write buffer charges or discharges the data bus line up to a VCC voltage level or down to a VSS voltage level in accordance with logic values of these input data signals.

In a fast page mode, after a write operation, the next read or write operation of new data is executed shortly thereafter. Accordingly, a write path or a read path of data must be recovered promptly by removing the data signals carried by the data bus line.

A time necessary for initializing the data bus line is called a write recovery time. When the write recovery time increases, operation speed decreases because of the longer time required to initialize the data bus line.

FIG. 1 shows a conventional circuit of an address decoder in semiconductor memory. The above-mentioned write recovery time is established by delaying a time, after a write operation, at which a corresponding word line is selected and subsequently activated by a new address to read data.

Referring to FIG. 1, the row address decoder is comprised of a least significant bit (hereinafter abbreviated LSB) decoder 101 and an address decoder 102. These two decoders act as a main decoder which activates a word line selection signal of a corresponding address by means of decoding a predecoded address signal generated from a predecoder (not shown). The generation of a predecoded address signal using a predecoder is well-known in the art and will not be described.

In the LSB decoder 101, a cell block address signal Z and a LSB X0 of a predecoded address signal, having bits X0 to X3, from the predecoder are decoded. For ease of description, a predecoded address signal of four bits is shown in FIG. 1. An address signal decoded by the LSB decoder 101 results in a power control signal which controls an output stage of the address decoder 102. As is known, the cell block address signal Z comes from decoding a portion of the lower bits of a row address. As shown in FIG. 1, the LSB decoder 101 includes a first NAND gate 103, receiving the block address signal Z and the bit X0 as inputs, and a first inverter 104 connected to the output of the first NAND gate 103.

The address decoder 102 decodes the bits X1 to X3 of the predecoded address signal. The address decoder 102 includes a plurality of decoding modules 150-1, 150-2, ..., 150-N, each of which is comprised of two AND gates (NAND+Inverter) that are connected in parallel.

The constitution of the address decoder 102 is explained in the following description wherein the decoding modules 150-1 to 150-N receive combinations of bits X1, X2, and X3, from the predecoded address signal, and bits '/X1, /X2, /X3' (i.e., the inverses of X1, X2, and X3).

First, bits /X1 to /X3 are inputted to a second NAND gate 105. When the logic value of the original predecoded address signal bits X1 to X3 are '0', the logic values of the inverted signals /X1 to /X3 become '1'. Thus, the output of the second NAND gate 105 is '0'.

The logic value '0' output from the second NAND gate 105 is inverted by a second inverter 106. One input terminal of a two input third NAND gate 107 is directly supplied with the output of the second inverter 106, while the other terminal is supplied with the output of the second inverter 106 through a delaying unit 110.

In this case, a low level output of the third NAND gate 107 is somewhat delayed due to the delaying unit 110. The delaying unit 110 includes third and fourth inverters 108 and 109 connected in series. The low level output of the third NAND gate 107 is inverted by fifth and sixth inverters 123 and 124 connected in parallel. Thus, the fifth and sixth inverters 123 and 124 produce two word line selection signals.

The fifth inverter 123 is controlled by the power control signal, while the sixth inverter 124 is controlled by an inverted power control signal. Accordingly, only one of the fifth and sixth inverters 123 and 124 activates the word line selection signal.

When a power control signal outputted from the first inverter 104 of the LSB decoder 101 has a low level, the fifth inverter 123 of the address decoder 102 turns on. Thus, a first word line selection signal becomes activated. On the other hand, when the power control signal has a high level, the sixth inverter 124 turns onto activate a second word line selection signal.

By connecting two inverters in parallel and having one of the two inverters turn on based on a power control signal, two word line selection signals will be generated from the first decoding module 150-1.

The other decoding modules 150-2 to 150-N, have the same structure as the first decoding module 150-1, but receive a different combination of the bits X1, X2 and X3 and their inverses.

Each of the decoding modules 150-1 to 150-N has a delaying unit to delay when a word line selection signal is activated. Delaying when the word line selection signal is activated means that a fixed time interval lies between a time when a new address is input and a time when a selected word line corresponding to a designated address is activated. The time interval is the write recovery time.

However, as a single address decoder includes a plurality of decoding modules and each of the decoding modules has a delaying units, the size of each delaying unit should be identical to ensure a precise write recovery time.

If even one of the sizes of the delaying units differs in size from another, it is difficult to set up a precise timing of a read or a write operation of the memory because the write recovery time becomes somewhat variable.

In order to overcome the above problem and perform a stable read/write operation of the memory, a sufficient margin is built into the write recovery time.

Unfortunately, this means the write recovery time takes longer than is necessary. It is very disadvantageous when trying to perform a fast operation that a time for reading new data takes longer due to the write recovery time being longer than necessary. Moreover, it is hard to achieve a high chip density because many delaying units are required.

SUMMARY OF THE INVENTION

Accordingly, the present invention is directed to a write recovery time control circuit and a control method thereof that substantially obviate one or more of the problems due to limitations and disadvantages of the related art.

Another object of the present invention is to provide a write recovery time control circuit and a control method thereof that optimizes a write recovery time by means of a single delaying unit for controlling a point of time at which a word line selection signal is activated, and reduces a chip size by decreasing the number of delaying units.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

These and other objects are achieved by providing a write recovery time control circuit, comprising: a power control signal generating circuit generating a power control signal based on a cell block address signal, at least one bit of a predecoded address signal, and a write disabling signal; a decoder circuit generating word line selection signals based on said predecoded address signal and said power control signal; and a write disabling signal generating circuit generating said write disabling signal such that changes in said power control signal are delayed by a predetermined period of time.

These and other objects are also achieved by providing a method of controlling a write recovery time, comprising: a) generating a power control signal based on a cell block address signal, at least one bit of a predecoded address signal, and a write disabling signal; b) generating word line selection signals based on said predecoded address signal and said power control signal; and c) generating said write disabling signal such that changes in said power control signal are delayed by a predetermined period of time.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

Figure 1:
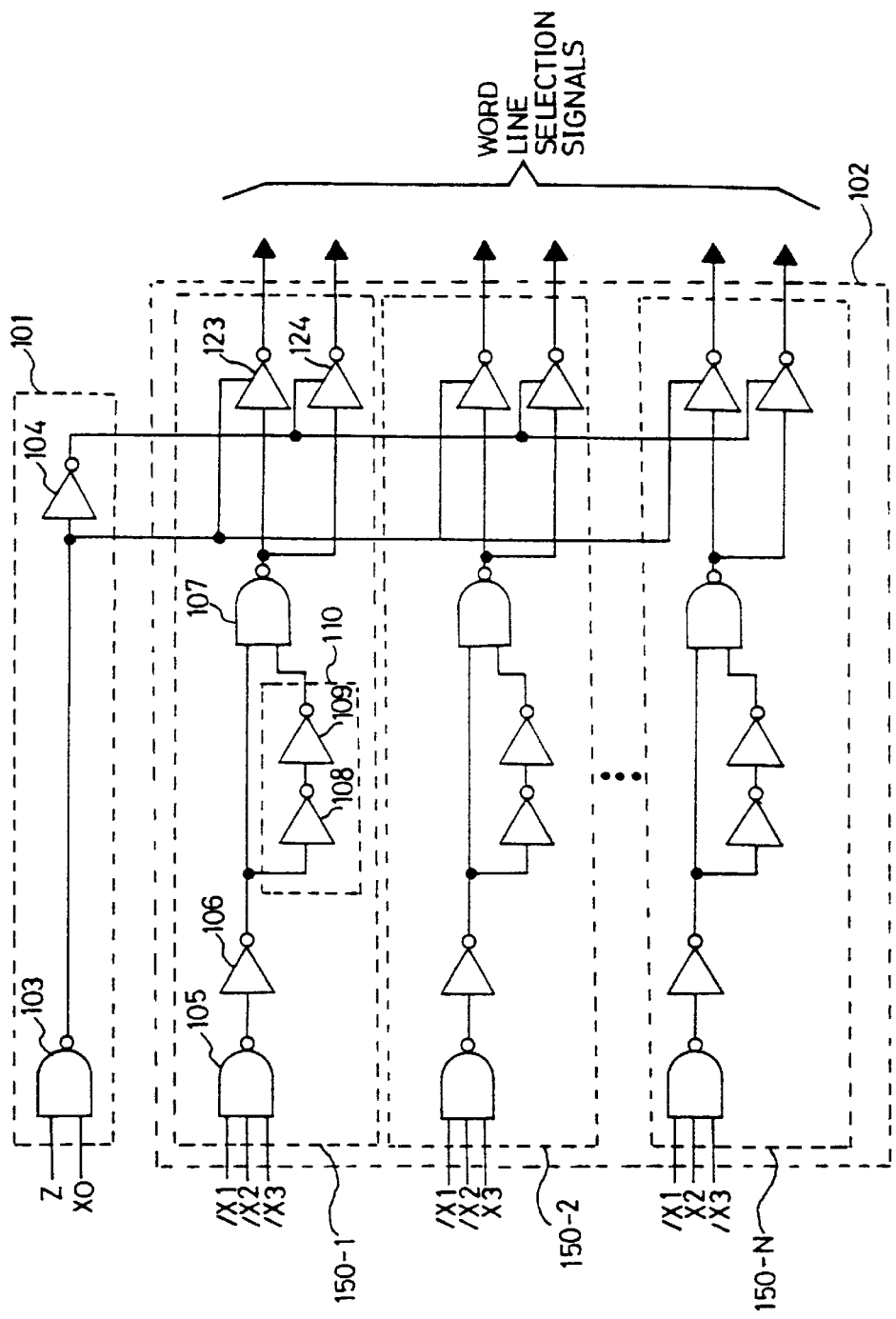
FIG. 1 shows a circuit of a conventional address decoder in a semiconductor memory.
Figure 2:
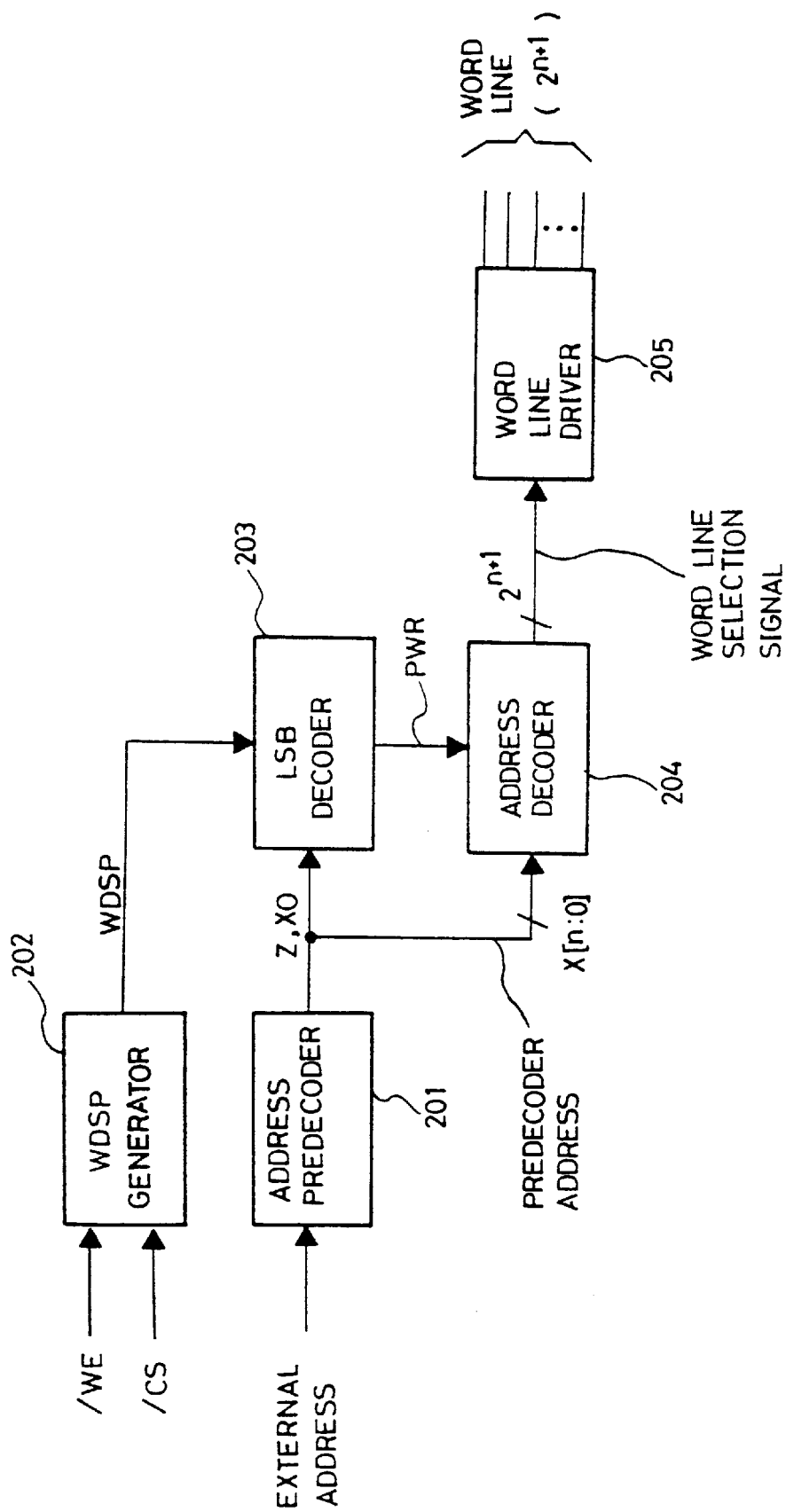
FIG. 2 shows a block diagram of a write recovery time control circuit according to the present invention.

FIG. 2 shows a block diagram of a write recovery time control circuit in semiconductor memory according to the present invention. Referring to FIG. 2, an external address is preliminarily decoded by an address predecoder 201 in the same well-known manner that the predecoded address signals were obtained for the conventional address decoder of FIG. 1.

A cell block address signal Z and a LSB X0 of the predecoded address signal generated by the address predecoder 201 are decoded based on a write disabling signal WDSP by a LSB decoder 203 to produce a power control signal PWR. The write disabling signal WDSP is generated by a write disabling signal generator 202 based on a write enabling bar signal /WE and a chip selection bar signal /CS for the associated semiconductor memory. The other bits of the predecoded address signal are decoded by an address decoder 204 to produce word line selection signals. Next, the word line selection signal are inputted to a word line driver 205 to drive corresponding word lines.

Figure 3:
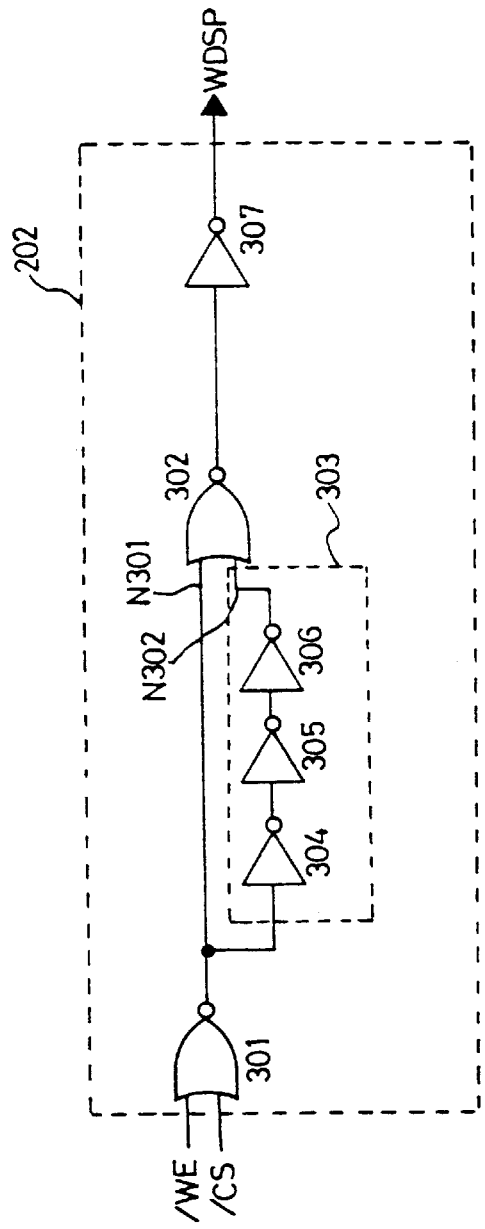
FIG. 3 shows a circuit of a write disabling signal generator in a write recovery time control circuit according to the present invention.

Specific constitution and operations of the write disabling signal generator 202 will be explained by referring to FIG. 3. FIG. 3 shows a circuit of a write disabling signal generator in a write recovery time control circuit according to the present invention. As shown, a write enabling bar signal /WE and a chip selection bar signal /CS are inputted to a first NOR gate 301. An output of the first NOR gate 301 is inputted to a second NOR gate 302 having first and second input terminals N301 and N302. The first input terminal N301 is directly supplied with an output of the first NOR gate 301, while the second input terminal N302 is indirectly supplied with the output of the first NOR gate 301 through a delaying unit 303. In this case, an output of the second NOR gate 302 is delayed by the delaying unit 303, and then inverted by an inverter 307 to generate a write disabling signal WDSP. As discussed in greater detail below, the write disabling signal WDSP includes a short negative or logic low pulse. The pulse width of this low level section of the write disabling signal WDSP depends on the size of the delaying unit 303.

The delaying unit 303 includes second, third and fourth inverters 304 to 306 connected in series. In this case, the number of inverters forming the delaying unit 303 should be odd and the size of each inverter is established based on a desired delayed time, which will depend on the intended purpose of the circuit.

When the semiconductor memory, with which the circuit of the present invention is associated, is activated, the chip selection bar signal /CS is fixed to a low level. Accordingly, a logic value output from the first NOR gate 301 is decided by the write enabling bar signal /WE. After the write operation has been completed, the write enabling bar signal /WE transitions to a high level, and as a result, the first NOR gate 301 generates a signal of low level.

The low level signal output from the first NOR gate 301 is directly inputted to the first input terminal N301 of the second NOR gate 302, the low level signal is also inputted to the second input terminal N302 after being delayed by the delaying unit 303. Accordingly, the output of the second NOR gate 302 becomes a short positive or logic high pulse. Then, the short positive pulse is inverted by the first inverter 307 to generate the short negative pulse of the write disabling signal WDSP.

As explained above, the write disabling signal WDSP is inputted to a LSB decoder 203. The function of the write disabling signal WDSP in the LSB decoder 203 is explained below with reference to FIG. 4.

Figure 4:
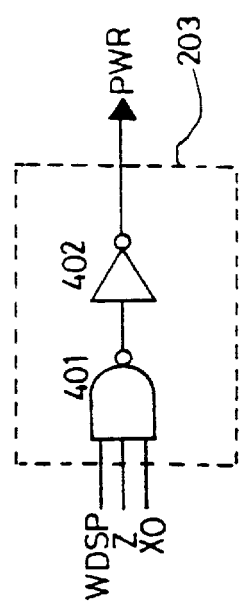
FIG. 4 shows a circuit of a LSB decoder in a write recovery time control circuit according to the present invention.

FIG. 4 shows a circuit of a LSB decoder in a write recovery time control circuit according to the present invention. As shown, a write disabling signal WDSP, a cell block address signal Z and the LSB X0 of a predecoded address signal are inputted to first NAND gate 401. A fifth inverter 402 inverts the output of the first NAND gate 401 to generate a power control signal PWR.

As is known, the cell block address signal Z is at a high level when selecting a corresponding cell block. Accordingly, at this time, a logic value of the output of the first NAND gate 401 depends on the write disabling signal WDSP and the LSB X0. The LSB X0 is decided by a predecoded address, which is an external address, and the write disabling signal WDSP plays a great role in controlling the effect of the LSB X0 on the power control signal PWR.

Namely, the logic value of the LSB X0 has no effect on the power control signal PWR while the write disabling signal WDSP is at the low level. Once the write disabling signal WDSP becomes high level, the logic value of the LSB X0 influences the power control signal PWR.

Figure 5:
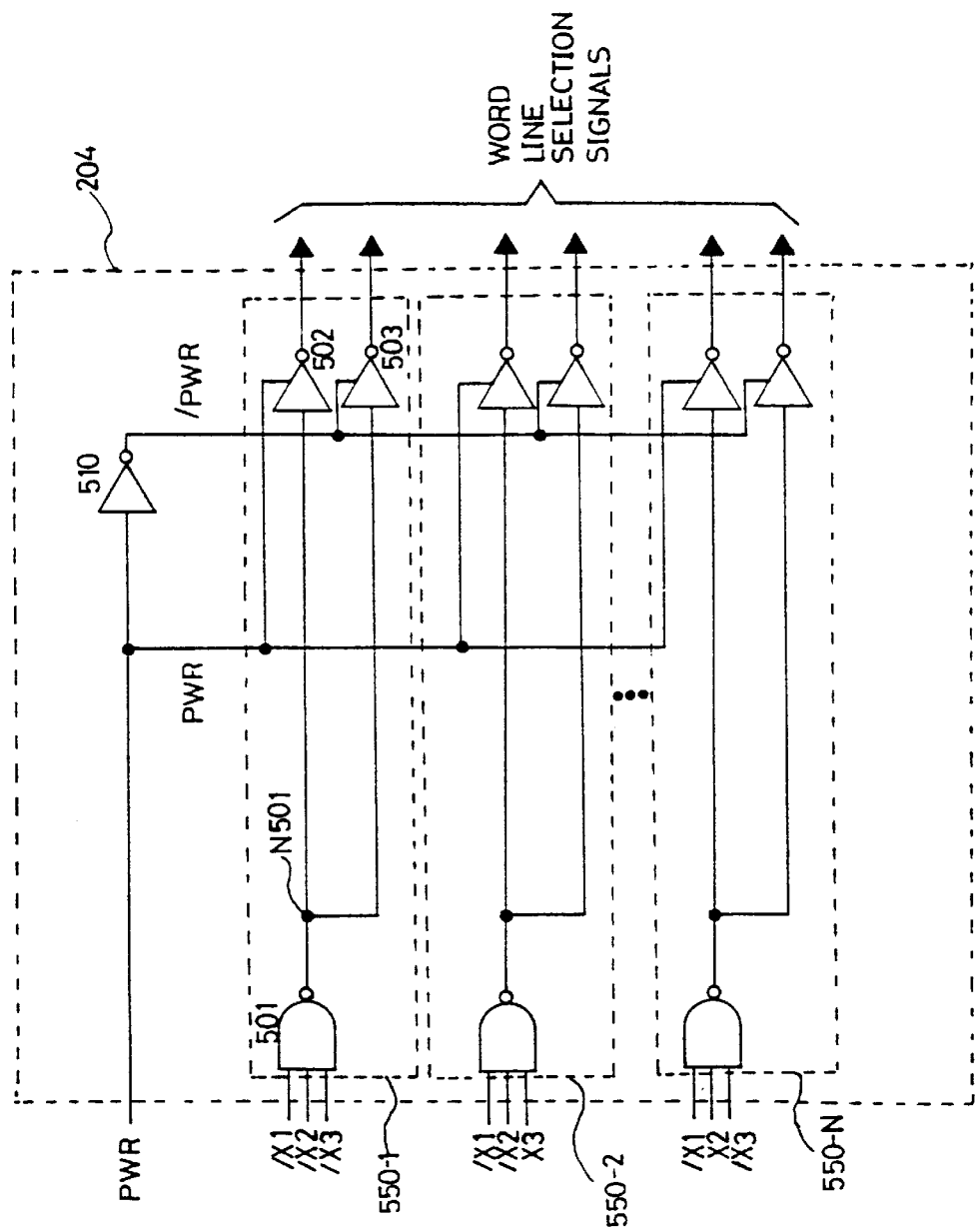
FIG. 5 shows a circuit of an address decoder in a write recovery time control circuit according to the present invention.

The function of the power control signal PWR is explained in below by referring to FIG. 5. FIG. 5 shows a circuit of an address decoder in a write recovery time control circuit according to the present invention. As shown, the address decoder 204 includes a plurality of decoding modules 550-1, 550-2, . . . , 550-N. Each of the decoding modules 550-1 to 550-N includes a NAND gate and two inverters, and is supplied with a combination of the bits X1, X2, and X3 of the predecoded address signal and the inverses thereof in the same manner as the decoder modules in the convention address decoder of FIG. 1. The structure of the address decoder 204 will be explained using the first decoding module 550-1 as an example.

First, bits /X1 to /X3 are inputted to a second NAND gate 501. When the bits /X1 to /X3 have the same logic value of '1', the output of the second NAND gate 501 becomes '0'. The low level output from the second NAND gate 501 is inverted by fifth and sixth inverters 502 and 503 connected in parallel. The outputs of the fifth and sixth inverters 502 and 503 are word line selection signals.

The fifth and sixth inverters 502 and 503 are enabled by the power control signal PWR and the inverse thereof. As shown, the inverse power enable signal /PWR is generated by supplying the power enable signal PWR to a seventh inverter 510. Accordingly, either the first inverter 502 or the second inverter 503 turns on.

Unlike the conventional address decoder of FIG. 1, the decoder modules 550-1 to 550-N in the address decoder 204 have no delaying units. Namely, the output of the NAND gate is directly outputted through the inverters as word line selection signals.

However, outputting a word line selection signal is delayed sufficiently by delaying the generation of a power control signal PWR.

Figure 6:
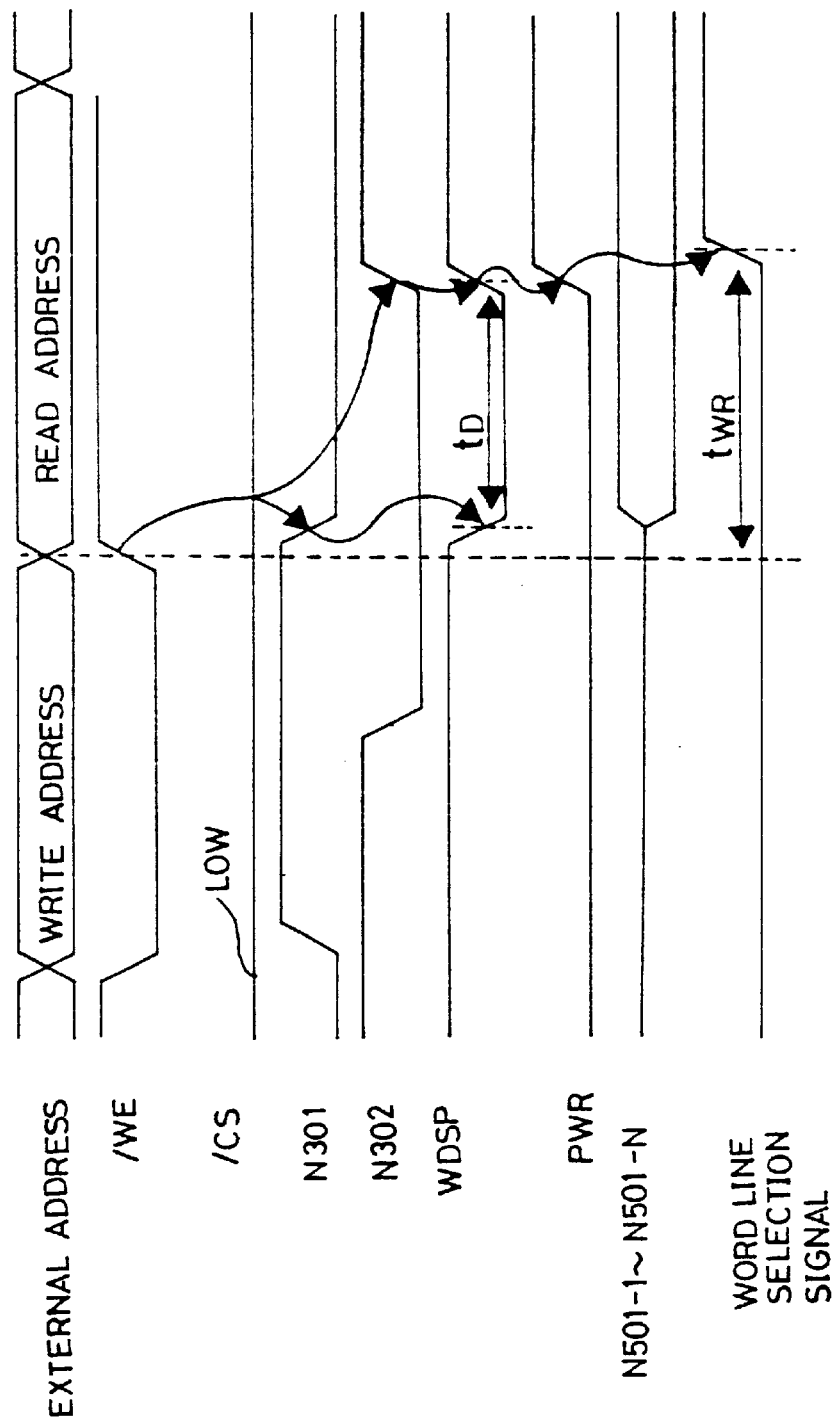
FIG. 6 shows a timing diagram of operational characteristics of a write recovery time control circuit according to the present invention.

FIG. 6 shows a timing diagram of operational characteristics of the write recovery time control circuit according to the present invention, wherein a write address is inputted. A write operation is performed while a write enabling bar signal /WE is at a low level and a chip selection bar signal /CS is fixed to the low level.

The labels 'N301' and 'N302' in FIG. 5 denote the signals received at the first and second inputs N301 and N302 of the second NOR gate 302. As shown, the first signal 'N301' becomes a high level signal as soon as the write enabling bar signal /WE goes low, but the second signal 'N302' has a logic value which is inverted from the value of the first signal 'N301' for a period of time equal to the delay of the delay unit 303. Consequently, an interval is generated between level shift time points of the two signals, and the write disabling signal WDSP becomes a short negative pulse for a period tD. As will be appreciated from the forgoing description, the period tD is substantially equal to the delay of the delay unit 303.

Signals indicated by labels 'N501-1' to 'N501-N' in FIG. 6 are outputs of the NAND gates 501 in the decoder modules 550-1 to 550-N, respectively. As the write disabling signal WDSP goes high, the power control signal PWR becomes high as well. A word line selection signal is generated as the power control signal PWR goes high. In this case, the outputs N501-1 to N501-N of the NAND gates 501 in the address decoder 204 have already been decided. Accordingly, the confirmed outputs N501-1 to N501-N of the NAND gates 501 are output as word line selection signals as soon as the power control signal PWR goes high.

A time tWR from when a read address is inputted to when the word line selection signal is activated is the write recovery time established by the present invention.

As shown in the above explanation, the write recovery time control circuit according to the present invention optimizes a write recovery time by using a single delaying unit for controlling a point of time at which a word line selection signal is activated. Accordingly, differences in write recover times between decoder modules does not occur, which permits precise timing of read and write operations. Using one instead of a plurality of delaying units also results in a reduced chip size.

It will be apparent to those skilled in the art that various modifications and variations can be made in a write recovery time control circuit and a control method thereof of the present invention without departing from the spirit or scope of the inventions. Thus, it is intended that the present invention cover the modifications and variations of this invention provided they come within the scope of the appended claims and their equivalents.

What is claimed is:

1. A write recovery time control circuit, comprising:
   a power control signal generating circuit generating a power control signal based on a cell block address signal, at least one bit of a predecoded address signal, and a write disabling signal;
   a decoder circuit generating word line selection signals based on said predecoded address signal and said power control signal; and
   a write disabling signal generating circuit generating said write disabling signal such that changes in said power control signal are delayed by a predetermined period of time.

2. The circuit of claim 1, wherein said power control signal generating circuit generates said power control signal based on at least one bit of said predecoded address signal when said cell block address signal and said write disabling signal are a first logic state.

3. The circuit of claim 2, wherein said write disabling signal generating circuit delays a transition of said write disabling signal from a second logic state to said first logic state by said predetermined period of time.

4. The circuit of claim 3, wherein said first logic state is logic high.

5. The circuit of claim 3, wherein said decoder circuit outputs said word line selection signals when said power control signal is at said first logic state.

6. The circuit of claim 5, wherein said first logic state is logic high.

7. The circuit of claim 1, wherein said decoder circuit outputs said word line selection signals when said power control signal is at a first logic state.

8. The circuit of claim 7, wherein said decoder circuit produces said word line selection signals based on said predecoded address signal.

9. The circuit of claim 8, wherein said decoder circuit produces said word line selection signals without delay.

10. The circuit of claim 1, wherein said decoder circuit includes a plurality of decoder modules, each decoder module producing one of said word line selection signals and each decoder module including an output section, each output section selectively outputting an associated one of said word line selection signals based on said power control signal.

11. The circuit of claim 10, wherein each output section outputs said associated one of said word line selection signals when said power control signal is at a first logic state.

12. The circuit of claim 11, wherein said first logic state is logic high.

13. The circuit of claim 10, wherein said power control signal generating circuit generates said power control signal based on at least one bit of said predecoded address signal when said cell block address signal and said write disabling signal are a first logic state.

14. The circuit of claim 13, wherein said write disabling signal generating circuit delays a transition of said write disabling signal from a second logic state to said first logic state by said predetermined period of time.

15. The circuit of claim 14, wherein said first logic state is logic high.

16. The circuit of claim 10, wherein each decoder module includes a single NAND gate.

17. The circuit of claim 1, wherein said write disabling signal generating circuit generates said write disabling signal based on a write enable signal and a chip enable signal for a semiconductor memory associated with said write recovery time control circuit.

18. The circuit of claim 17, wherein
said decoder circuit outputs said word line selection signals when said power control signal is active;
said power control signal generating circuit generates an active power control signal when said write disabling signal is a first logic state; and
said write disable generating circuit causes said write disabling signal to transition to said first logic state said predetermined period of time after said chip enable signal indicates said semiconductor memory is active and said write enable signal indicates completion of a write operation to said semiconductor memory.

19. The circuit of claim 1, wherein said write disabling signal generating circuit includes a single delay unit delaying changes in said write disabling signal from occurring.

20. A method of controlling a write recovery time, comprising:
a) generating a power control signal based on a cell block address signal, at least one bit of a predecoded address signal, and a write disabling signal;
b) generating word line selection signals based on said predecoded address signal and said power control signal; and
c) generating said write disabling signal such that changes in said power control signal are delayed by a predetermined period of time.

21. The method of claim 20, wherein said step a) generates said power control signal based on at least one bit of said predecoded address signal when said cell block address signal and said write disabling signal are a first logic state.

22. The method of claim 21, wherein said step c) delays a transition of said write disabling signal from a second logic state to said first logic state by said predetermined period of time.

23. The method of claim 22, wherein said first logic state is logic high.

24. The method of claim 22, wherein said step b) comprises:
b1) outputting said word line selection signals when said power control signal is at said first logic state.

25. The method of claim 24, wherein said first logic state is logic high.

26. The method of claim 20, wherein said step b) comprises:
b1) outputting said word line selection signals when said power control signal is at a first logic state.

27. The method of claim 26, wherein said step b) further comprises:
b2) producing said word line selection signals based on said predecoded address signal.

28. The method of claim 27, wherein said step b2) produces said word line selection signals without delay.

29. The method of claim 20, wherein said step c) generates said write disabling signal based on a write enable signal and a chip enable signal for a semiconductor memory associated with said write recovery time control circuit.

30. The method of claim 29, wherein
said step b) outputs said word line selection signals when said power control signal is active;
said step a) generates an active power control signal when said write disabling signal is a first logic state; and
said step c) causes said write disabling signal to transition to said first logic state said predetermined period of time after said chip enable signal indicates said semiconductor memory is active and said write enable signal indicates completion of a write operation to said semiconductor memory.

31. A write recovery time control circuit, comprising:
a write disabling signal generating circuit to output a write disabling signal which changes state a predetermined period of time after a change of state of an input write enable signal;
a least significant bit decoder to output a power control signal from inputs of the write disabling signal, a cell block address signal, and one bit of a predecoded address signal; and
an address decoder to generate word line address signals from inputs of the predecoded address signal and the power control signal.

32. The write recovery time control circuit of claim 31, wherein the one bit is a least significant bit of the predecoded address signal.

33. The write recovery time control circuit of claim 31, further comprising:
an address predecoder to generate the predecoded address signal from an external address.

34. The write recovery time control circuit of claim 31, wherein the write disabling signal generating circuit has an additional input of a chip select signal, and the write disabling signal changes state a predetermined period of time after both the write enable signal and the chip select signal change to a predetermined state.

* * * * *